(12) United States Patent
Wörz

(10) Patent No.: US 6,652,291 B2
(45) Date of Patent: Nov. 25, 2003

(54) LEADFRAME INTERPOSER

(75) Inventor: Andreas Wörz, Kelheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/218,705

(22) Filed: Aug. 14, 2002

(65) Prior Publication Data

US 2003/0027437 A1 Feb. 6, 2003

Related U.S. Application Data

(63) Continuation of application No. PCT/DE01/00283, filed on Jan. 25, 2001.

(30) Foreign Application Priority Data

Feb. 14, 2000 (DE) .......................................... 100 06 445

(51) Int. Cl.[7] .............................................. H01R 12/00
(52) U.S. Cl. ............................ 439/69; 439/68; 439/70
(58) Field of Search .............................. 439/69, 70, 68

(56) References Cited

U.S. PATENT DOCUMENTS

| | | | | |
|---|---|---|---|---|
| 3,825,801 A | * | 7/1974 | Beavitt et al. | 361/767 |
| 4,688,870 A | * | 8/1987 | Egawa et al. | 439/331 |
| 4,696,525 A | | 9/1987 | Coller et al. | |
| 5,233,131 A | * | 8/1993 | Liang et al. | 174/52.4 |
| 5,484,959 A | | 1/1996 | Burns | |
| 5,508,565 A | | 4/1996 | Hatakeyama et al. | |
| 5,702,984 A | | 12/1997 | Bertin et al. | |
| 5,902,152 A | * | 5/1999 | Robert | 439/620 |
| 5,978,227 A | | 11/1999 | Burns | |
| 6,291,881 B1 | * | 9/2001 | Yang | 257/723 |
| 6,364,669 B1 | * | 4/2002 | Andric et al. | 439/70 |

FOREIGN PATENT DOCUMENTS

| | | |
|---|---|---|
| DE | 199 33 265 A1 | 2/2001 |
| WO | WO 99/65062 | 12/1999 |

OTHER PUBLICATIONS

IBM Technical Disclosure Bulletin: "Alterable Interposer Block For Personalizing Stacked Module Interconnections", Vo. 30, No. 8, pp. 373–374.

* cited by examiner

*Primary Examiner*—P. Austin Bradley
*Assistant Examiner*—Edwin A. León
(74) *Attorney, Agent, or Firm*—Laurence A. Greenberg; Werner H. Stemer; Ralph E. Locher

(57) ABSTRACT

The leadframe interposer is provided with an upset which is formed by shaping in a central region and enlarges the vertical dimension of the interposer there in such a way that, during the assembly of a housing stack of a plurality of semiconductor chips, the upset presses against a topside or underside of a chip housing in such a way that a compensating torque is exerted on the interposer, which prevents a possible strain or deformation when the leads are pressed onto the contact regions of the interposer. The contact regions are laterally offset with respect to one another.

7 Claims, 1 Drawing Sheet

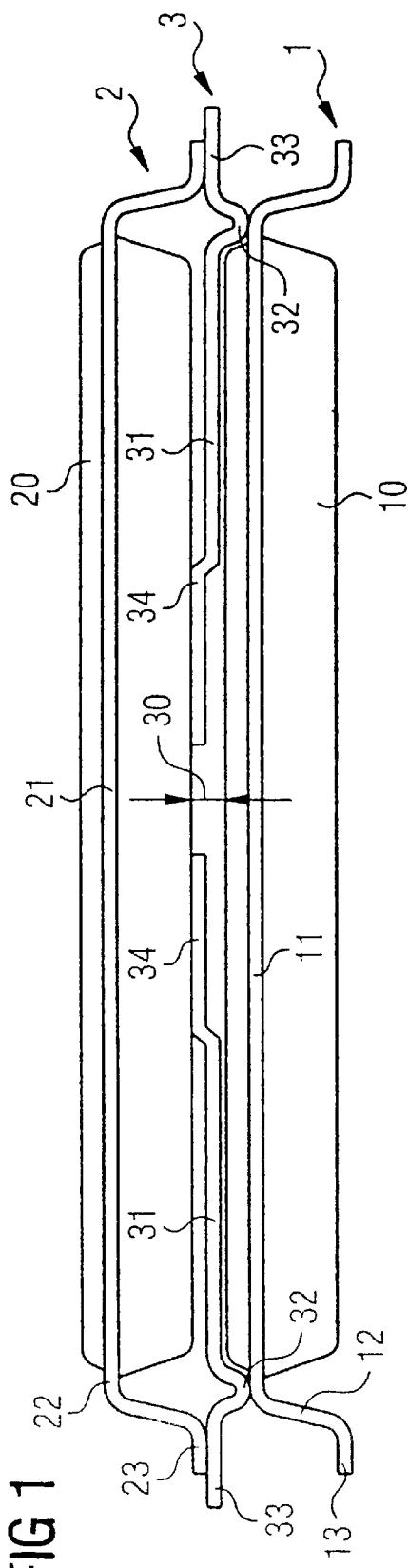
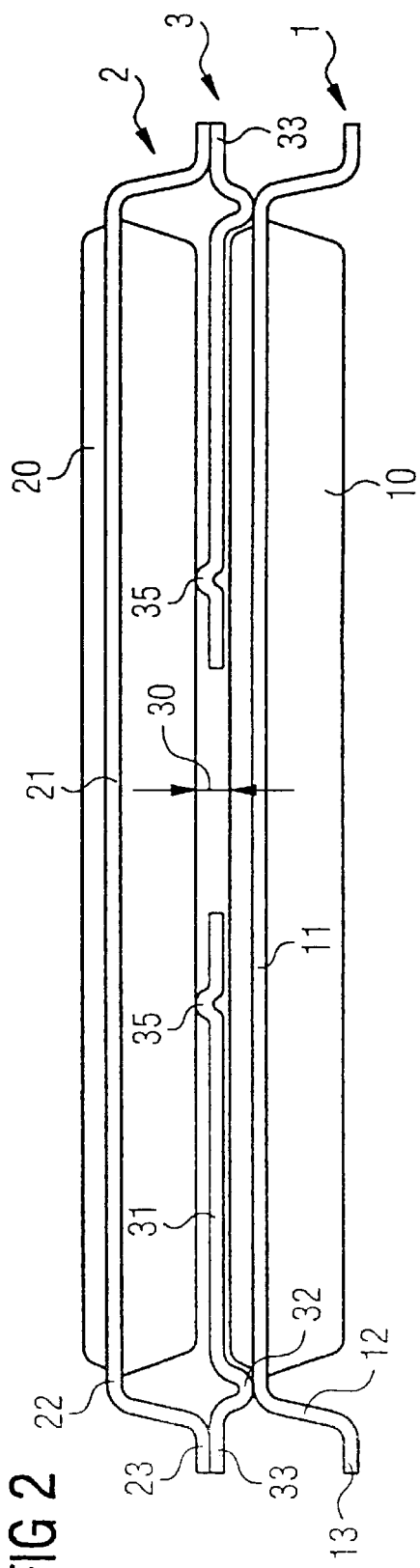

LEADFRAME INTERPOSER

CROSS-REFERENCE TO RELATED APPLICATION

This application is a continuation of International Application No. PCT/DE01/00283, filed Jan. 25, 2001, which designated the United States and which was not published in English.

BACKGROUND OF THE INVENTION

Field of the Invention

The invention lies in the field of semiconductor fabrication technology. More specifically, the present invention relates to an interposer for the electrically conductive connection of leads on leadframes of semiconductor chips.

In order to achieve a greater integration density in semiconductor components, semiconductor chips are also mounted vertically one above the other in stacks. U.S. Pat. No. 5,702,984 describes an integrated structure comprising a multiplicity of modularly constructed memory chips. Intermediate layers are situated between the chip carriers and they are provided with metalizations for the electrical connection and the interconnection of the chips. The metalizations are connected to one another by interconnects provided on the side of the semiconductor chip stack. U.S. Pat. No. 5,978,227 describes a vertically integrated configuration of semiconductor chips on leadframes, wherein laterally provided connecting contact springs have in each case upwardly or downwardly bent metal lugs with which the vertical electrical contact-making is effected on the side of the stack.

Electrical contact can be made with leads on leadframes of semiconductor chip housings also through the use of an interposer. Such an interposer is preferably composed of metal in order to have sufficient mechanical stability, on the one hand, and electrical conductivity, on the other hand. However, it suffices, in principle, for those portions of the interposer that are provided for the vertical conductive connection to be formed in electrically conductive fashion. The semiconductor chips are provided on a carrier, e.g. encapsulated with a potting compound, in a leadframe having outwardly directed leads. If the semiconductor chip housings are placed vertically one above the other, the associated leads must be electrically conductively connected to one another, which is done via the corresponding parts of the interposer. For this purpose, the interposer has contact regions on its mutually opposite surfaces. During the mounting of the semiconductor chip housings placed one above the other, the leads of the leadframes are pressed onto these contact regions, thereby establishing an electrically conductive contact. Since these contact regions are usually offset laterally relative to one another, when the housing stacks are pressed together, forces occur which lead to torques in the edge region of the interposer, which result in a strain or deformation of the interposer.

SUMMARY OF THE INVENTION

It is accordingly an object of the invention to provide a leadframe interposer, which overcomes the above-mentioned disadvantages of the heretofore-known devices and methods of this general type and which provides for an improved possibility for the assembly of semiconductor chip housings to form stacks, which improves in particular the vertical contact-making.

With the foregoing and other objects in view there is provided, in accordance with the invention, an interposer for the electrically conductive connection of leads on leadframes of semiconductor chips, the interposer having a planar extent and, on mutually opposite surfaces, electrically conductive contact regions. Furthermore:

a) a respective leadframe of a semiconductor chip is placed above and below the interposer and is connected to the interposer with pressure being exerted; and b) an electrically conductive connection between leads of the leadframes is thus effected by the contact regions of the interposer; and the interposer has at least one upset, which is formed and arranged in such a way that it engages on a housing of a semiconductor chip in a leadframe connected to the interposer.

In accordance with an added feature of the invention, the upset is formed with a level region oriented coplanar with respect to the planar extent of the interposer body and different from the contact regions.

In accordance with an additional feature of the invention, the upset is formed by at least one bead in a region of the interposer body different from the contact regions.

In accordance with another feature of the invention, the upset is formed by at least one bump in a region of the interposer body different from the contact regions.

In accordance with a further feature of the invention, the contact regions of the interposer body are offset with respect to one another in the planar extent of the interposer body, and the contact regions and the upset are arranged relative to one another such that a torque generated by forces exerted on the contact regions by the leadframes connected to the interposer is compensated for by a force exerted on the upset by at least one housing of one of the semiconductor chips in the leadframes.

In accordance with again an added feature of the invention, the contact areas are present on an outer edge of the interposer body and the upset is formed in a central region thereof.

In accordance with again another feature of the invention, a height, measured perpendicularly to the planar extent, is greater than a distance between the contact areas measured perpendicularly to the planar extent.

With the above and other objects in view there is also provided, in accordance with the invention, a stack of semiconductor chips, comprising:

an interposer having a generally planar extent with mutually opposite surfaces and being formed with electrically conductive contact regions on the mutually opposite surfaces a first semiconductor chip with a leadframe having leads disposed on the interposer and a second semiconductor chip with a leadframe having leads disposed on the interposer opposite from the first semiconductor chip;

respective the contact regions of the interposer being electrically connected between respective the leads of the leadframes;

the interposer body being formed with at least one upset disposed to engage on a housing of a semiconductor chip in a leadframe connected to the interposer.

In other words, the interposer according to the invention is a leadframe interposer which is provided with an upset or a deformation. The upset is formed by shaping of the interposer in a central region. The upset alters the vertical position of the interposer in the central region and, during the assembly of the housing stack, presses against a topside or underside of a chip housing, so that a compensating further torque is exerted on the interposer, which prevents a possible strain or deformation when the leads are pressed onto the contact regions.

Other features which are considered as characteristic for the invention are set forth in the appended claims.

Although the invention is illustrated and described herein as embodied in a leadframe interposer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross section between two assembled semiconductor chip housings with leadframes illustrating a first exemplary embodiment of the interposer according to the invention; and FIG. 2 is a similar view of a second exemplary embodiment of the invention.

DESCRIPTION OF THE PREFERRED EMBODIMENTS

Referring now to the figures of the drawing in detail and first, particularly, to FIG. 1 thereof, there is shown a detail from a stack of semiconductor chips in chip housings. The semiconductor chip of the lower chip plane 1 illustrated has a chip housing 10 fixed in a leadframe 11. The connecting contacts of the semiconductor chip are electrically conductively connected to corresponding contact areas of the leadframe 11, for example by means of bonding wires, which is known per se and not illustrated here. The leadframe 11 has leads 12 with a contact region 13 which is provided for electrical connection to the next chip plane. The semiconductor chip of the chip plane 2 arranged thereabove likewise has a chip housing 20 and also a leadframe 21 with leads 22 and a contact region 23 provided for vertical contact-making. The interposer 3 according to the invention is arranged between said chip planes 1, 2, for the vertical conductive connection. This interposer 3 essentially has a planar extent which extends between the chip housings 10, 20 and has planar portions 31 arranged in this plane. Said planar portions 31 may, if appropriate, be subdivided into mutually separate, e.g. radially running portions, so that, by means of a suitable electrical insulation between these portions, connection of a plurality of vertical connections is also possible by means of the interposer.

On an outer edge, the interposer 3 has contact regions 32, 33 which are arranged on two mutually opposite surfaces of the interposer 3 and effect the electrically conductive connection to the leads 12, 13 and 22, 23 of the leadframes of the semiconductor chips that are arranged above and below the interposer.

The configuration of the leads and the position of the contact regions have the effect that when the leadframes 11, 21 are pressed onto one another, a torque occurs in the interposer between the respective contact regions 32, 33, so that the inner portions of a conventional interposer would be bent out of the plane of the interposer in an undefined manner and a deformation or strain of the interposer would thus arise. According to the invention, however, there is formed on the interposer 3 a deformation 34—referred to as an upset 34 in the following—which enlarges the vertical dimension of the interposer 3 in a central region, with the result that, after mounting, one chip housing 20 presses against the upset 34 and thus compensates for the torque acting on the contact regions. What is thus brought about, to a certain extent, is a parallel orientation—in the vertical direction of the arrangement—of the forces acting, so that, in a manner distributed practically over the entire level region of the interposer, forces directed perpendicularly thereto act and enable the chip stack to be pressed together uniformly. In this case, the upset of the interposer compensates for the height difference between the contact point of the contact region 23 and the underside of the chip housing 20.

In accordance with the alternative exemplary embodiment illustrated in FIG. 2, the deformations or upsets 35 of the interposer 3 may also be formed by beads or bumps which act only on narrowly delimited regions of the chip housing 20. The remaining component parts illustrated in FIG. 2 correspond to the respective component parts of the arrangement in accordance with FIG. 1, in accordance with the unambiguous assignment by the reference symbols.

With the upsets 34, 35 present on the interposer according to the invention, the vertical dimension of the interposer 3 is enlarged in a region between the chip housings 10, 20 of the semiconductor chips, arranged adjacent to the interposer, in such a way that the interposer 3 is supported in a manner acting practically over the whole area. The vertical extent of the upsets 34, 35 is determined by the distance 30 between the chip housings 10, 20. In this case, it should be taken into account that, in this example, the lower contact regions 32 seated on corresponding leads 12 of the lower leadframe 11 are arranged somewhat below the surface of the housing 10. The planar portions 31 which essentially make up the plane of the interposer 3 have a topside which, in this example, lies at the level of the contact regions 23 of the leads 22 of the upper leadframe 21. The distance that is still present between this plane and the underside of the upper chip housing 20 is filled by the upset 34, 35. The upper chip housing 20 therefore presses onto the upset 34, 35, while the upper leadframe 21 presses via the leads onto the upper contact regions 33 of the interposer 3. Since the regions wherein the forces act lie on both sides of the lower contact region 32, on which the counter force effected by the lower leadframe 11 acts, the interposer 3 is loaded only such that no appreciably deformations or strains are produced in the interposer 3.

A particular advantage of this interposer is that a secure connection of the leads on the contact regions 32, 33 of the interposer is possible, since the position of the contact regions 32, 33 is stabilized by the pressure on the upsets 34, 35 which is exerted by a respective chip housing. The interposer is therefore clamped in mechanically stably, thereby simplifying the production of the electrical connections between the leadframes of the chip stack and the interposer, the separation of the leads provided for the contact-making from interconnects also being facilitated. The interposer according to the invention is particularly suitable for the assembly of TSOP modules (thin small outline package).

I claim:

1. An interposer for electrically connecting a leadframe of a first semiconductor chip placed above the interposer and a leadframe of a second semiconductor chip placed below the interposer, the leadframes being pressure-connected to the interposer and having leads, the interposer comprising:

an interposer body of generally planar extent with mutually opposite surfaces and electrically conductive contact regions formed on the mutually opposite surfaces, said contact regions of the interposer effecting an electrically conductive connection between the respective leads of the leadframes;

said interposer body being formed with at least one upset, formed and disposed to engage on a housing of a semiconductor chip in a leadframe connected to the interposer body;

said contact regions of said interposer body being offset with respect to one another in the planar extent of said interposer body, said contact regions and said upset being disposed relative to one another to compensate for a torque generated by forces exerted on said contact regions by the leadframes connected to the interposer with a force exerted on said upset by at least one housing of one of the semiconductor chips in the leadframes.

2. The interposer according to claim 1, wherein said upset is formed with a level region oriented coplanar with respect to the planar extent of the interposer body and different from the contact regions.

3. The interposer according to claim 1, wherein said upset is formed by at least one bead in a region of the interposer body different from the contact regions.

4. The interposer according to claim 1, wherein said upset is formed by at least one bump in a region of the interposer body different from the contact regions.

5. The interposer according to claim 1, wherein the contact areas are present on an outer edge of the interposer body and the upset is formed in a central region thereof.

6. The interposer according to claim 1, wherein a height, measured perpendicularly to the planar extent, is greater than a distance between the contact areas measured perpendicularly to the planar extent.

7. A stack of semiconductor chips, comprising:

an interposer having a generally planar extent with mutually opposite surfaces and being formed with electrically conductive contact regions on the mutually opposite surfaces a first semiconductor chip with a leadframe having leads disposed on said interposer and a second semiconductor chip with a leadframe having leads disposed on said interposer opposite from said first semiconductor chip;

respective said contact regions of said interposer being electrically connected between respective said leads of said leadframes;

said interposer being formed with at least one upset disposed to engage on a housing of a semiconductor chip in a leadframe connected to said interposer;

said contact regions of said interposer being offset with respect to one another in the planar extent of said interposer, said contact regions and said upset being disposed relative to one another to compensate for a torque generated by forces exerted on said contact regions by the leadframes connected to the interposer with a force exerted on said upset by at least one housing of one of the semiconductor chips in the leadframes.

* * * * *